United States Patent [19]
Schmitt

[11] Patent Number: 6,028,449
[45] Date of Patent: Feb. 22, 2000

[54] INTEGRATED CIRCUIT I/O BUFFER HAVING PULL-UP TO VOLTAGES GREATER THAN TRANSISTOR TOLERANCE

[75] Inventor: Jonathan Schmitt, Bloomington, Minn.

[73] Assignee: LSI Logic Corporation, Milpitas, Calif.

[21] Appl. No.: 08/906,343

[22] Filed: Aug. 5, 1997

[51] Int. Cl.[7] ...................... H03K 19/0175; H03K 19/00
[52] U.S. Cl. ............................... 326/80; 326/81; 326/87; 326/58
[58] Field of Search ................................. 326/80, 81, 57, 326/58, 86, 87, 83, 121

[56] References Cited

U.S. PATENT DOCUMENTS

| | | | |
|---|---|---|---|
| 5,266,849 | 11/1993 | Kitahara et al. | 307/475 |
| 5,300,832 | 4/1994 | Rogers | 307/475 |
| 5,321,324 | 6/1994 | Hardee et al. | 307/475 |
| 5,338,978 | 8/1994 | Larsen et al. | 307/443 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,467,031 | 11/1995 | Nguyen et al. | 326/81 |
| 5,537,059 | 7/1996 | Asahina | 326/81 |
| 5,541,534 | 7/1996 | Cao et al. | 326/81 |
| 5,559,464 | 9/1996 | Orii et al. | 327/333 |
| 5,663,663 | 9/1997 | Cao et al. | 326/81 |
| 5,736,869 | 4/1998 | Wei | 326/81 |

*Primary Examiner*—Michael Tokar
*Assistant Examiner*—Richard Roseen
*Attorney, Agent, or Firm*—Westman, Champlin & Kelly, P.A.

[57] ABSTRACT

An integrated circuit having a DC current test function operates at a core supply voltage and interfaces at an input-output (I/O) supply voltage. The I/O supply voltage is greater than the core supply voltage. The integrated circuit includes a buffer, a voltage level shifting circuit and a pull-up circuit. The buffer is coupled between a core terminal and a pad terminal. The pad terminal has a voltage swing which is substantially equal to the I/O supply voltage. The voltage level shifting circuit has a test signal input with a voltage swing substantially equal to the core supply voltage and a test signal output with a voltage swing from the I/O supply voltage to a selected bias voltage. The pull-up circuit is coupled to the pad terminal and has a control terminal coupled to the test signal output. The pull-up circuit pulls the pad terminal toward the I/O supply voltage during normal operation and selectively isolates the pad terminal from the I/O supply voltage as a function of the test signal during a DC current test.

19 Claims, 3 Drawing Sheets

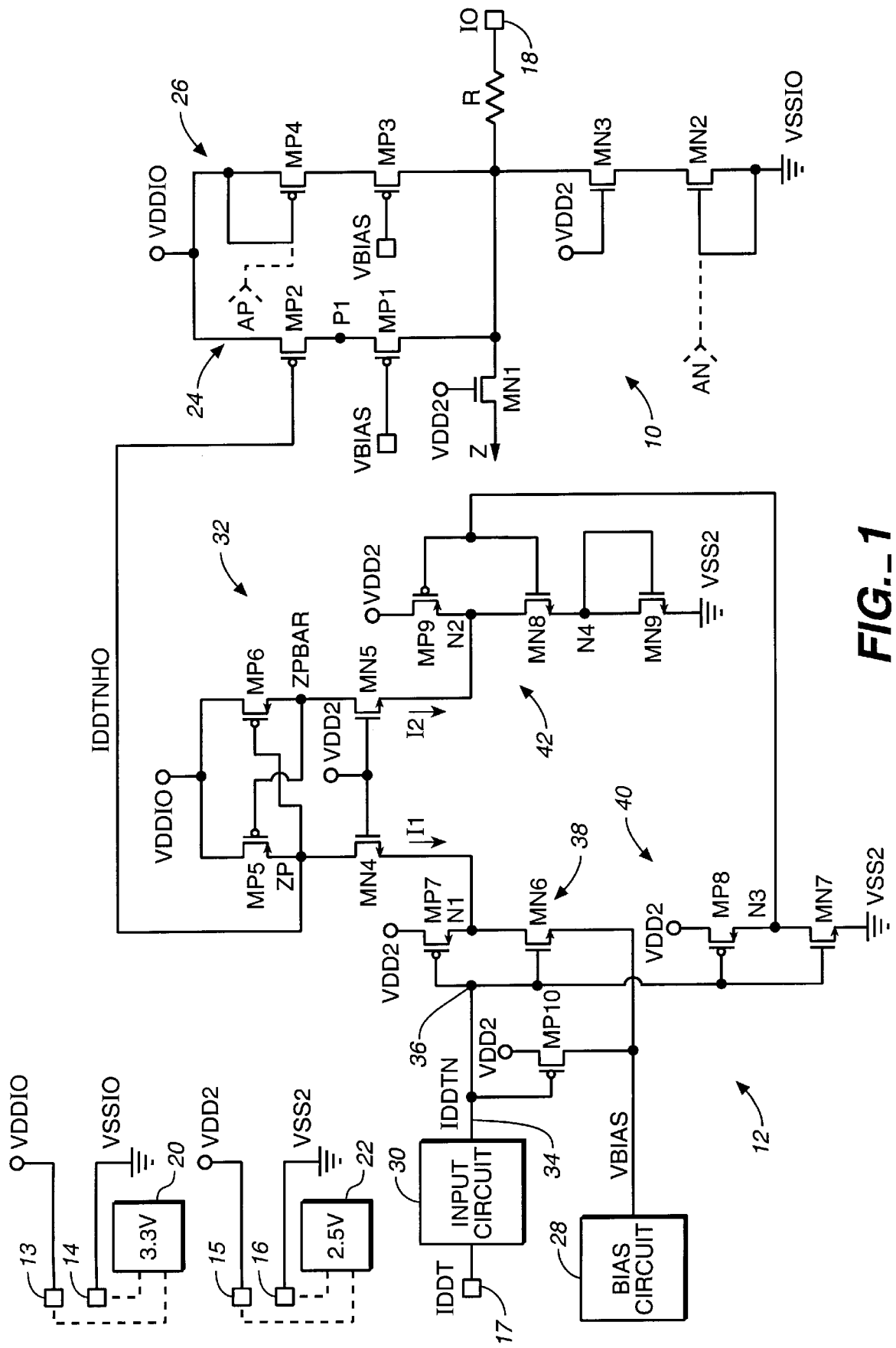
FIG._1

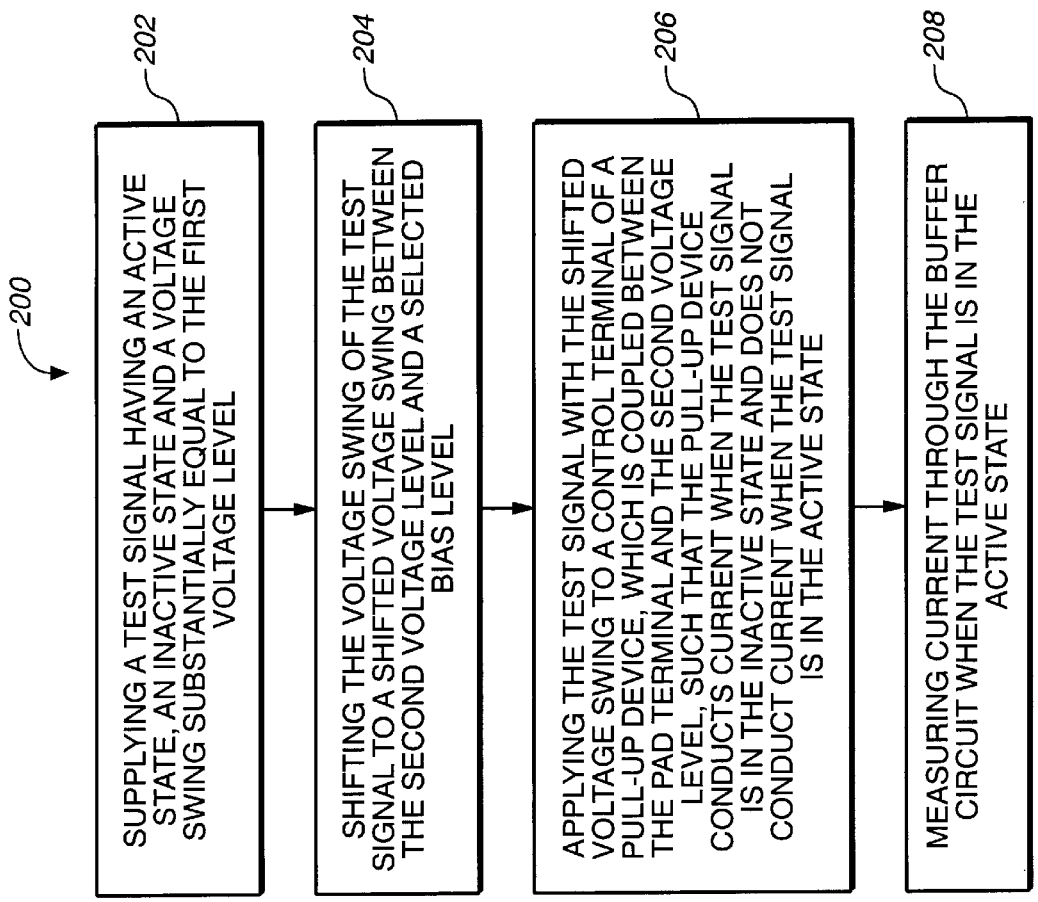
FIG._4
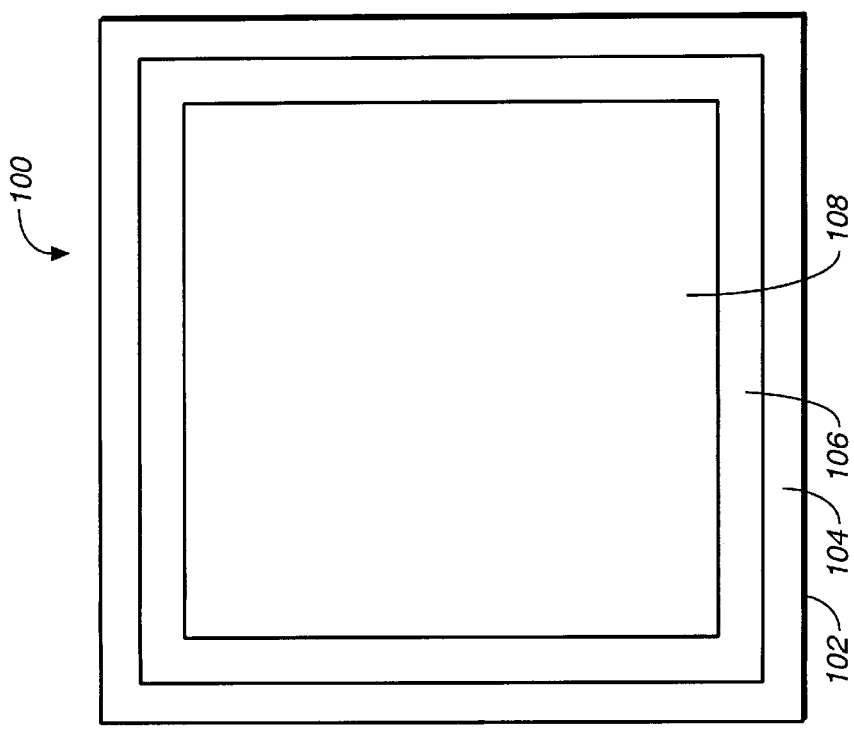
FIG._2

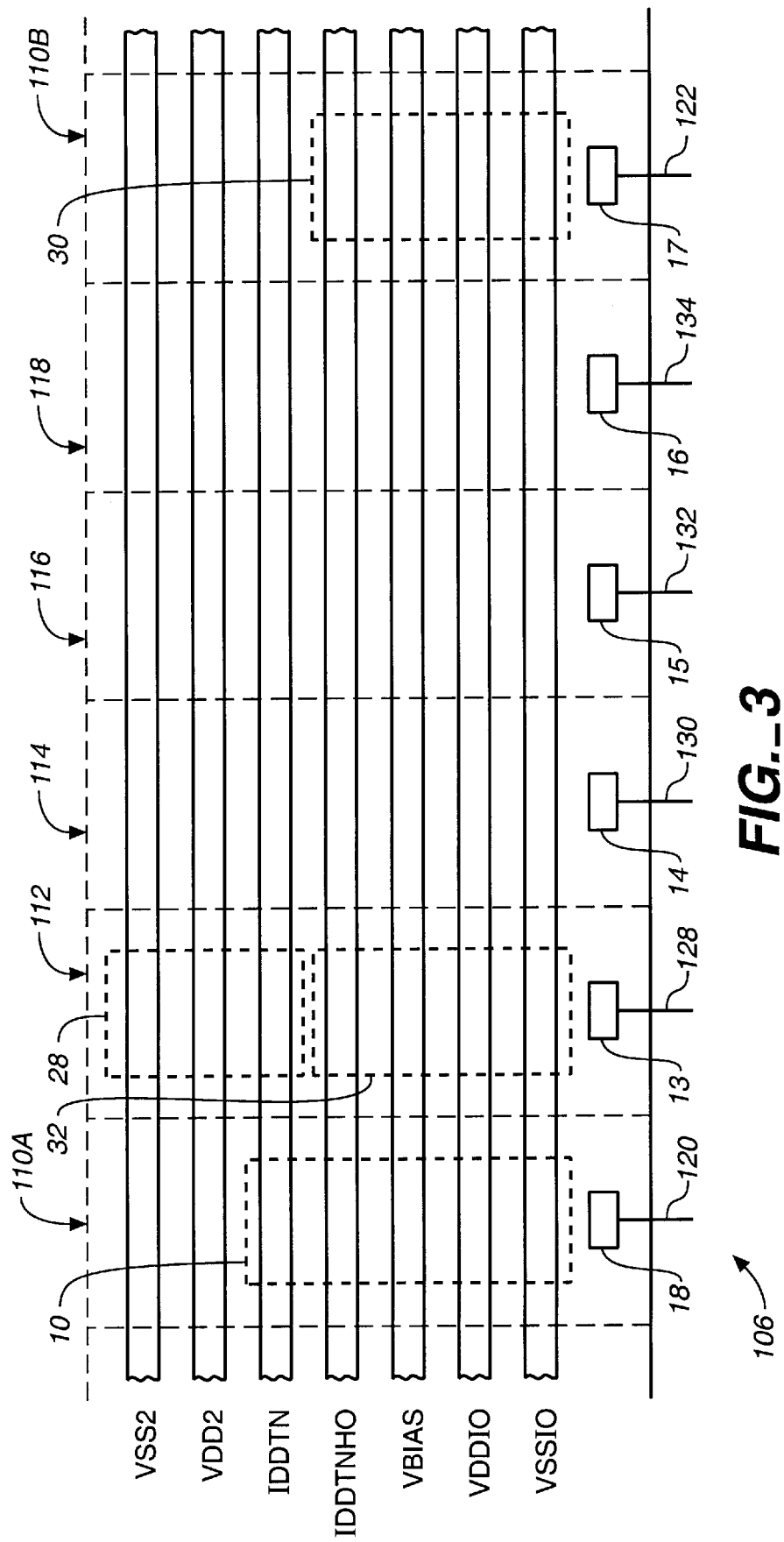
FIG._3

ര6,028,449

INTEGRATED CIRCUIT I/O BUFFER HAVING PULL-UP TO VOLTAGES GREATER THAN TRANSISTOR TOLERANCE

BACKGROUND OF THE INVENTION

The present invention relates to semiconductor integrated circuits, and more particularly, to an input-output (I/O) buffer having a pull up device which pulls the I/O pad to a voltage that is greater than transistor tolerances.

Advancements in semiconductor integrated circuit fabrication technology enable the geometries of semiconductor devices to be progressively reduced so that more devices can fit on a single integrated circuit. As a result, core voltages of the integrated circuits are being reduced to prevent damage to the small devices and to reduce power consumption. For example, power supplies are now being reduced from 5 V to 3.3 V, and from 3.3 V to 2.5 V.

These low voltage devices are often interconnected at a board level to TTL logic and other devices that operate at higher supply voltages of 5 V or 3.3 V. If no precautions are taken, an external 3.3 V level signal applied to the output terminal of a 2.5 V I/O buffer can cause voltage drops across the transistor devices in the I/O buffer that exceed the transistor tolerances, which can cause the gate oxide of the transistors to break down. I/O buffers are therefore being developed to interface with large voltages without exceeding the tolerance levels of the devices within the integrated circuit.

Also, when multiple integrated circuits share a board level bus, it is desirable that the bus have a known logic value when all I/O buffers connected to that bus are in a tri-state mode. This prevents "crow bar" current in the I/O buffers and unknown states within the integrated circuits. One methodology of defining the logic state of a board level bus is to provide I/O buffers with small, built-in pull-up or pull-down devices that can be easily overdriven when the I/O buffer is in use but will drive the bus to a supply voltage rail when all I/O buffers connected to that bus are in the tri-state mode.

SUMMARY OF THE INVENTION

The integrated circuit of the present invention operates at a core supply voltage and interfaces at an input-output (I/O) supply voltage. The I/O supply voltage is greater than the core supply voltage. The integrated circuit includes a buffer, a voltage level shifting circuit and a pull-up circuit. The buffer is coupled between a core terminal and a pad terminal. The pad terminal has a voltage swing which is substantially equal to the I/O supply voltage. The voltage level shifting circuit has a test signal input with a voltage swing substantially equal to the core supply voltage and a test signal output with a voltage swing from the I/O supply voltage to a selected bias voltage. The pull-up circuit is coupled to the pad terminal and has a control terminal coupled to the test signal output.

In one embodiment, the test input receives a test signal having an active state and an inactive state. The pull-up circuit pulls the pad terminal toward the I/O supply voltage when the test signal is in the inactive state and isolates the pad terminal from the I/O supply voltage through the pull-up circuit when the test signal is in the active state. The pull-up circuit includes a weak P-channel pull-up transistor which defines a logic state of the pad terminal when the buffer is in a tri-state mode or when no other circuit element is driving the pad terminal.

The voltage level shifting circuit allows the pull-up transistor to pull the pad terminal to the I/O supply voltage instead of the degraded core supply voltage without exceeding any voltage tolerance levels of the devices in the circuit and allows the test signal to shut the pull-up transistor off completely during DC current testing of the integrated circuit.

BRIEF DESCRIPTION OF THE DRAWINGS

FIG. 1 is schematic diagram of an I/O buffer coupled to a DC current testing circuit within an integrated circuit according to the present invention.

FIG. 2 is a plan view of a semiconductor die on which the circuit shown in FIG. 1 is fabricated.

FIG. 3 is a fragmentary, plan view of an I/O region within the semiconductor die shown in FIG. 2.

FIG. 4 is a flow chart of steps used for testing DC current through a buffer circuit.

DETAILED DESCRIPTION OF THE PREFERRED EMBODIMENTS

FIG. 1 is schematic diagram of an I/O buffer 10 coupled to a DC current testing circuit 12 within an integrated circuit according to the present invention. In the embodiment shown in FIG. 1, the integrated circuit operates at a 2.5 V core voltage and interfaces at a 3.3 V I/O voltage. The integrated circuit includes a plurality of input and output pad terminals, including power supply pad terminals 13, 14, 15 and 16, DC current test pad terminal 17 and I/O pad terminal 18. Power supply pad terminals 13 and 14 are coupled to voltage supply terminals VDDIO and VSSIO, respectively, for supplying the 3.3 V I/O interface voltage to the I/O region of the integrated circuit. Power supply pad terminals 15 and 16 are coupled to voltage supply terminals VDD2 and VSS2, respectively, for supplying the 2.5 V core voltage to the core region of the integrated circuit. The I/O supply voltage and the core supply voltage are provided by external 3.3 V and 2.5 V power supplies 20 and 22.

I/O buffer 10 is coupled between I/O pad terminal 18 and core terminal Z. I/O buffer 10 includes input transistor MN1, pull-up circuit 24, output driver circuit 26 and electrostatic discharge (ESD) protection resistor R. Input transistor MN1 has a gate coupled to voltage supply terminal VDD2, a source coupled to core terminal Z and a drain coupled to I/O pad terminal 18, through resistor R. Pull-up circuit 24 includes P-channel voltage protection transistor MP1 and P-channel pull-up transistor MP2. Voltage protection transistor MP1 has a gate coupled to voltage bias node VBIAS, a drain coupled to resistor R and a source coupled to node P1. Pull-up transistor MP2 has a gate coupled to test output node ZP of DC current test circuit 12, a source coupled to voltage supply terminal VDDIO and a drain coupled to node P1.

Output driver circuit 26 includes N-channel pull-down transistor MN2, N-channel voltage protection transistor MN3, P-channel voltage protection transistor MP3 and P-channel pull-up transistor MP4. Pull-down transistor MN2 has a gate and source coupled to voltage supply terminal VSSIO and a drain coupled to the source of voltage protection transistor MN3. Voltage protection transistor MN3 has a gate coupled to voltage supply terminal VDD2 and a drain coupled to resistor R. Voltage protection transistor MP3 has a gate coupled to voltage bias node VBIAS, a source coupled to the drain of pull-up transistor MP4 and a drain coupled to resistor R. Pull-up transistor MP4 has a gate and source coupled to voltage supply terminal VDDIO.

In the embodiment shown in FIG. 1, I/O buffer 10 is configured as an input-only buffer. Data signals received on I/O pad terminal 13 are transmitted through input transistor MN1 to core terminal Z for processing by the integrated circuit. Output driver circuit 26 is disabled. Pull-down and pull-up transistors MN2 and MP4 are off since the gate of transistor MN2 is coupled to voltage supply terminal VSSIO and the gate of transistor MP4 is coupled to voltage supply terminal VDDIO. In an input-output buffer or an output-only buffer, the gates of pull-down transistor MN2 and pull-up transistor MP4 would be driven at node AN and AP, respectively, shown in phantom by an output predriver circuit which is controlled by data signals received from the core region of the integrated circuit.

Pull-up circuit 24 provides a weak pull-up current to I/O pad terminal 18 which defines the logic state of I/O pad terminal 18 at 3.3 V when all devices coupled to I/O pad terminal 18, either within buffer 10 or at the board level, are in a tri-state mode. When multiple integrated circuits share a board level bus, it is desirable that the bus have a known logic state when all I/O buffers connected to that bus in the tri-state mode. This helps prevent "crow bar" current and unknown states within the integrated circuits. The weak pull-up current provided by pull-up circuit 24 can be easily over-driven when I/O pad terminal 18 is in use.

Pull-up circuit 24 allows I/O pad terminal 18 to be pulled to the 3.3 V I/O supply voltage without exceeding any tolerances of the transistors in the circuit, which are fabricated in a 2.5 V process, and allows the pull-up circuit to be completely disabled during DC current testing of the integrated circuit. Each transistor in I/O buffer 10, and in particular pull-up circuit 24, is biased such that the gate-to-source, gate-to-bulk and gate-to-drain voltages are all less than a 3.0 V to prevent damage to the transistors. Also, each transistor is biased such that the drain-to-source voltages are less than a 2.75 V.

Voltage bias node VBIAS is held to about 0.8 V by bias circuit 28. Bias circuit 28 can include any suitable bias generator, such as resistor tree, a biased current source or a self-fed inverter. When I/O pad terminal is at 0 V, node P1 discharges toward 0 V. As node P1 drops below the voltage on voltage bias node VBIAS, transistor MP1 turns off, preventing further discharge of node P1 and an over voltage condition on transistor MP2. When I/O pad terminal 18 is at 3.3 V, the gate-to-source voltage of transistor MP1 is kept below 3.0 V since its gate is tied to 0.8 V.

During DC current testing, all sources of DC current in the integrated circuit are shut off, and the DC current drawn through power supply pad terminals 13, 14, 15 and 16 is measured. If the current exceeds a specified tolerance, there may be a short or some other fault condition in the integrated circuit. The DC current drawn by pull-up circuit 24 is shut off by driving the gate of pull-up transistor MP2 with a level-shifted DC current test signal IDDTNHO. In a normal mode of operation, test signal IDDTNHO is set to about 0.8 V, which turns on pull-up transistor MP2 on and keeps the drain-gate voltage of transistor MP2 to less than a 2.75 V tolerance for a minimum sized transistor. In a DC current test mode, test signal IDDTNHO is driven to the 3.3 V I/O voltage, rather than the 2.5 V core voltage, which allows pull-up transistor MP2 to be shut off completely during DC current testing.

Test signal IDDTNHO is generated by DC current test circuit 12, at output node ZP. DC current test circuit 12 includes input circuit 30 and voltage level shifting circuit 32. Input circuit 30 is coupled to I/O pad terminal 17 for receiving a DC current test signal IDDT. Test signal IDDT is active high. Input circuit 30 includes an input buffer similar to buffer 10 and other input control circuitry which receive test signal IDDT and generate an inverted test signal IDDTN on output 34. Inverted test signal IDDTN has a voltage swing which is substantially equal to the 2.5 V core supply voltage.

Voltage level shifting circuit 32 receives the inverted test signal IDDTN, inverts the signal and supplies the signal as the level-shifted test signal IDDTNHO on test output node ZP. Test signal IDDTNHO has a voltage swing of about 0.8 V–3.3 V. Voltage level shifting circuit 32 includes input control terminal 36, test output node ZP, inverters 38, 40 and 42, P-channel cross coupled transistor pair MP5 and MP6 and voltage protection transistors MN4 and MN5. Inverters 38, 40 and 42 form a differential circuit which defines first and second current paths I1 and I2 through nodes N1 and N2, respectively. Inverter 38 includes N-channel transistor MN6 and P-channel transistor MP7. Transistor MN6 has a gate coupled to input control terminal 36, a source coupled to voltage bias node VBIAS and a drain coupled to the drain of transistor MP7, at node N1. Transistor MP7 has a gate coupled to input control terminal 36, a source coupled to voltage supply terminal VDD2 and a drain coupled to node N1.

Inverter 40 includes N-channel transistor MN7 and P-channel transistor MP8. Transistor MN7 has a gate coupled to input control terminal 36, a source coupled to voltage supply terminal VSS2 and drain coupled to the drain of transistor MP8, at node N3. Transistor MP8 has a gate coupled to input control terminal 36 and a source coupled to voltage supply terminal VDD2. Inverter 42 includes N-channel transistor MN8 and P-channel transistor MP9. Transistor MN8 has a gate coupled to node N3, a source coupled to node N4 and a drain coupled to node N2. Transistor MP9 has a gate coupled to N3, a source coupled to voltage supply terminal VDD2 and a drain coupled to node N2. N-channel bias transistor MN9 is coupled between the source of transistor MN8 and voltage supply terminal VSS2. Bias transistor MN9 has a gate and drain coupled to the source of transistor MN8 and a source coupled to voltage supply terminal VSS2. Bias transistor MN9 maintains a minimum voltage of about 0.8 V at node N4.

Voltage protection transistor MN4 has a gate coupled to voltage supply terminal VDD2, a source coupled to node N1 and a drain coupled to test output node ZP. Voltage protection transistor MN5 has a gate coupled to voltage supply terminal VDD2, a source coupled to node N2 and a drain coupled to node ZPBAR. Transistors MP5 and MP6 are cross coupled with one another. The gate of transistor MP5 is coupled to node ZPBAR and the drain of transistor MP6. The drain of transistor MP5 is coupled to test output node ZP and the gate of transistor MP6. The source of transistor MP6 is coupled to voltage supply terminal VDDIO and the source of transistor MP6.

In the normal mode of operation, test signal IDDT is inactive at a logic low state. Inverted test signal IDDTN goes high to about 2.5 V, which turns on transistor MN6. Transistor MN6 discharges nodes N1 and ZP low toward the 0.8 V level at voltage bias node VBIAS. Similarly, the logic high level of the inverted test signal IDDTN turns on transistor MN7, which pulls node N3 low and turns on transistor MP9. Transistor MP9 charges node N2 toward the 2.5 V level at voltage supply terminal VDD2.

Since the source of transistor MP5 is tied to 3.3 V, the voltage at node ZP should be held above a certain minimum, such as 0.8 V, to prevent an over voltage condition on transistor MP5. When node ZP discharges to about 2.5 V, through transistor MN6, the drain-to-gate voltage of transistor MN4 becomes negative, at which time transistor MN4 turns off, preventing further discharge of node ZP. The low voltage on node ZP turns on transistor MP6 which charges node ZPBAR and node N2 toward 3.3 V. The high voltage on node ZPBAR turns off transistor MP5. As node N2 reaches an NMOS threshold voltage below the gate of transistor MN4, which is at 2.5 V, transistor MN5 turns off and thereafter prevents further charging of node N2. The low voltage on test output node ZP turns on pull-up transistor MP2 in pull-up circuit 24, which provides a weak pull-up current that defines the logic state of I/O pad terminal 18 when all other devices coupled to the I/O pad terminal are in a tri-state mode.

When a DC current test is to be performed on the integrated circuit on which the circuit shown in FIG. 1 is fabricated, test signal IDDT is set to a logic high level. Inverted test signal IDDTN goes low, which turns off N-channel transistors MN6 and MN7 and turns on P-channel transistors MP7 and MP8. Transistor MP7 pulls node N1 toward 2.5 V, while transistor MP8 pulls node N3 toward 2.5 V. P-channels transistor MP9 turns off, and N-channel transistor MN8 turns on. Transistors MN8 discharges nodes N2 and ZPBAR toward the 0.8 V level on node N4. The low voltage on node ZPBAR turns on transistor MP5, which charges nodes ZP and N1 toward 3.3 V and turns off transistor MP6. As node N1 reaches an NMOS threshold voltage below the gate of transistor MN4, which is at 2.5 V, transistor MN4 turns off. This prevents further charging of node N1 and thereby protects transistor MN6 from an over voltage condition with respect to its gate, which is at 0 V. The 3.3 V high voltage on node ZP turns off pull-up transistor MP2 in pull-up circuit 24 which prevents any DC current from flowing through pull-up circuit 24 during the DC current test.

Since bias circuit 28 is also a source of DC current, inverted test signal IDDTN is coupled to the gate of P-channel pull-up transistor MP10, which is coupled between voltage supply terminal VDD2 and voltage bias node VBIAS. When inverted test signal IDDTN is in the active low state, transistor MP10 pulls voltage bias node VBIAS high toward 2.5 V which prevents DC current from flowing through bias circuit 28.

An advantage of the voltage level shifting circuit of the present invention is that pull-up transistor MP2 is able to pull I/O pad terminal 18 to the 3.3 V I/O supply voltage instead of the degraded 2.5 V core voltage without placing any of the transistors in the circuit at risk because of the raised voltage level. Also, the 3.3 V level shifted voltage at the gate of transistor MP2 allows transistor MP2 to be shut off completely during the DC current test. If a 2.5 V signal were used to shut off transistor MP2, transistor MP2 would not be shut off completely, decreasing the accuracy of the DC current test.

FIG. 2 is a plan view of a semiconductor die on which the circuit shown in FIG. 1 is fabricated. Die 100 includes perimeter 102, scribe region 104, I/O region 106 and core region 108. I/O region 106 and core region 108 each have a plurality of semiconductor devices or cells. I/O region 106 extends along scribe region 104 and surrounds core region 108. Die 100 has a plurality of routing layers for routing interconnections between the devices within I/O region 106 and core region 108. Each interconnection or "wire" includes one or more segments of conductive material which are routed in a specified pattern within the various routing layers on die 100.

FIG. 3 is a plan view of I/O slots 110A and 110B and power slots 112, 114, 116 and 118 within I/O region 106.

Power supply buses VDDIO, VSSIO, VDD2 and VSS2 extend along I/O region 106, through the I/O and power slots and generally parallel to perimeter 102. I/O buffer 10 (shown in phantom) is fabricated within I/O slot 110 and is electrically coupled to I/O pad terminal 18. Lead 120 extends between I/O pad terminal 18 and an I/O pin of the integrated circuit package in which die 100 is housed.

Input circuit 30 (shown in phantom) is fabricated within I/O slot 110B. Input circuit 30 generates inverted test signal IDDTN, which is coupled to a global bus, labeled IDDTN, which is routed along power supply buses VDDIO, VSSIO, VDD2 and VSS2. Lead 122 is coupled between I/O pad terminal 17 and a respective I/O pins of the integrated circuit package.

Since bias circuit 28 (shown in phantom) and voltage level shifting circuit 32 (also shown in phantom) require a non-trivial amount of die space, these circuits are fabricated within one the power slots, such as slot 112, rather than in each of the I/O slots. Bias circuit 28 generates a global bias voltage on node VBIAS, which is coupled to a global bus labeled VBIAS in FIG. 3. The global VBIAS bus is routed along the power supply buses VDDIO, VSSIO, VDD2 and VSS2 within I/O region 106. Voltage level shifting circuit 32 generates a global test signal IDDTNHO, which is coupled to a global bus labeled IDDTNHO in FIG. 3. Global bus IDDTNHO is also routed along I/O region 106 to the I/O buffers of a plurality of I/O slots.

Power supply pad terminals 13, 14, 15 and 16 are positioned along perimeter 102 within power and ground slots 112, 114, 116 and 118, respectively. Power supply pad terminals 13 and 14 are coupled to power supply buses VDDIO and VSSIO, respectively. Power supply pad terminals 15 and 16 are coupled to power supply buses VDD2 and VSS2, respectively. Leads 128, 130, 132 and 134 extend between power supply terminals 13, 14, 15 and 16 and the power and ground pins of the integrated circuit package in which die 100 is housed.

FIG. 4 is a flow chart illustrating a method 200 for testing DC current through a buffer circuit, which is coupled a core terminal and a pad terminal in an integrated circuit. The integrated circuit operates at a first voltage level and interfaces with a second voltage level at the pad terminal. The second voltage level is greater than the first voltage level. At step 202, a test signal is supplied having an active state, an inactive state and a voltage swing substantially equal to the first voltage level. At step 204, the voltage swing of the test signal is shifted to a shifted voltage swing, between the second voltage level and a selected bias level. At step 206, the test signal with the shifted voltage swing is applied to a control terminal of a pull-up device, which is coupled between the pad terminal and the second voltage level, such that the pull-up device conducts current when the test signal is in the inactive state and does not conduct current when the test signal is in the active state. At step 208, current through the buffer circuit is measured when the test signal is in the active state.

Although the present invention has been described with reference to preferred embodiments, workers skilled in the art will recognize that changes may be made in form and detail without departing from the spirit and scope of the invention. For example, the circuit shown in FIG. 1 can be implemented with various technologies, including CMOS, and can have circuit configurations. The transistors shown in FIG. 1, can include individual transistors or an array of transistors coupled together in parallel with one another. Also, the voltage supply terminals can be relatively positive or relatively negative, depending upon the particular convention adopted and the technology used. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. An integrated circuit which operates at a core supply voltage and interfaces at an input-output (I/O) supply voltage, which is greater than the core supply voltage, the integrated circuit comprising:
    a core terminal;
    a pad terminal having a voltage swing substantially equal to the I/O supply voltage;
    an output driver circuit having a pull-up transistor and a pull-down transistor coupled to the pad terminal;
    a DC current test node having an inactive state in a normal mode and an active state in a DC current test mode;
    a buffer coupled between the core terminal and the pad terminal;
    a voltage level shifting circuit having a test signal input coupled to the DC current test node, with a voltage swing substantially equal to the core supply voltage and a test signal output with a voltage swing from the I/O supply voltage to a selected bias voltage; and
    a pull-up circuit coupled to the pad terminal in parallel with the pull-up transistor and having a control terminal coupled to the test signal output.

2. The integrated circuit of claim 1 wherein the test input receives a test signal having an active state and an inactive state and wherein the pull-up circuit comprises means for pulling the pad terminal toward the I/O supply voltage when the test signal is in the inactive state and for isolating the pad terminal from the I/O supply voltage through the pull-up circuit when the test signal is in the active state.

3. The integrated circuit of claim 1 and further comprising:
    a pair of voltage supply terminals for supplying the I/O supply voltage; and
    wherein the pull-up circuit comprises a P-channel pull-up transistor having a gate coupled to the test signal output, a drain coupled to the pad terminal and a source coupled to one of the voltage supply terminals.

4. The integrated circuit of claim 3 and further comprising:
    a bias circuit which generates a bias voltage on a bias voltage output; and
    a P-channel voltage protection transistor coupled between the P-channel pull-up transistor and the pad terminal and having a gate coupled to the bias voltage output, a drain coupled to the pad terminal and a source coupled to the drain of the P-channel pull-up transistor.

5. The integrated circuit of claim 1 wherein the voltage level shifting circuit comprises:
    a differential circuit defining first and second current paths and having an input control terminal coupled to the test signal input which controls current through the first and second current paths, wherein the differential circuit operates at the core supply voltage; and
    a cross coupled transistor pair coupled in the first and second current paths and having a first output terminal in the first current path and a second output terminal in the second current path, wherein the first output terminal is coupled to the control terminal of the pull-up circuit.

6. The integrated circuit of claim 5 wherein the differential circuit comprises:
    a first inverter coupled between the input control terminal a first node in the first current path; and
    second and third inverters coupled together in series between the input control terminal and a second node in the second current path.

7. The integrated circuit of claim 6 and further comprising:
    first and second supply terminals for supplying the core supply voltage;
    third and fourth supply terminals for supplying the I/O supply voltage;
    a bias circuit which generates a bias voltage on a bias voltage output; and
    wherein the first inverter comprises an N-channel transistor and a P-channel transistor which are coupled together in series between the first voltage supply terminal and the bias voltage output.

8. The integrated circuit of claim 6 and further comprising:
    first and second supply terminals for supplying the core supply voltage;
    third and fourth supply terminals for supplying the I/O supply voltage; and
    wherein the second inverter comprises an N-channel transistor and a P-channel transistor which are coupled together in series between the first and second voltage supply terminals.

9. The integrated circuit of claim 6 and further comprising:
    first and second supply terminals for supplying the core supply voltage;
    third and fourth supply terminals for supplying the I/O supply voltage;
    wherein the third inverter comprises a first N-channel transistor and a first P-channel transistor which are coupled together in series between the first voltage supply terminal and a bias node; and
    a second N-channel transistor having a gate and drain coupled to the bias node and a source coupled to the second supply terminal.

10. The integrated circuit of claim 1 wherein the output driver circuit is disabled.

11. The integrated circuit of claim 1 wherein the output driver circuit is enabled and wherein has a first data signal input and the pull-down branch has a second data signal input.

12. The integrated circuit of claim 3 wherein a high voltage is applied to the gate of the pull-up transistor during DC current testing, thereby preventing DC current from flowing through the pull-up circuit during DC current testing.

13. The integrated circuit of claim 1 wherein the pull-up circuit has a weaker drive strength than the output driver circuit.

14. A buffer circuit for an integrated circuit which operates at a core supply voltage and interfaces at an input-output (I/O) supply voltage, which is greater than the core supply voltage, the buffer circuit comprising:
    a core terminal;
    a pad terminal having a voltage swing substantially equal to the I/O supply voltage;

a buffer coupled between the core terminal and the pad terminal;

an output driver circuit having a pull-up transistor and a pull-down transistor coupled to the pad terminal;

a DC current test node having an inactive state in a normal mode and an active state in a DC current test mode;

a voltage level shifting circuit having a test signal input coupled to the DC current test node, with a voltage swing substantially equal to the core supply voltage and a test signal output with a voltage swing from the I/O supply voltage to a selected bias voltage; and a pull-up circuit coupled to the pad terminal in parallel with the pull-up transistor and having a control terminal coupled to the test signal output.

15. The buffer circuit of claim 14 wherein the test signal input receives a test signal having an active state and an inactive state and wherein the pull-up circuit comprises means for pulling the pad terminal toward the I/O supply voltage when the test signal is in the inactive state and for isolating the pad node from the I/O supply voltage through the pull-up circuit when the test signal is in the active state.

16. The buffer circuit of claim 14 and further comprising:

a pair of voltage supply terminals for supplying the I/O supply voltage; and wherein the pull-up circuit comprises a P-channel pull-up transistor having a gate coupled to the test signal output, a drain coupled to the pad terminal and a source coupled to one of the voltage supply terminals.

17. The buffer circuit of claim 16 and further comprising:

a bias circuit which generates a bias voltage on a bias voltage output; and a P-channel voltage protection transistor coupled between the P-channel pull-up transistor and the pad terminal and having a gate coupled to the bias voltage output, a drain coupled to the pad terminal and a source coupled to the drain of the P-channel pull-up transistor.

18. A method of testing DC current through a buffer circuit which is coupled between a core terminal and a pad terminal in an integrated circuit that operates at a first voltage level and which interfaces with a second voltage level at the pad terminal, wherein the second voltage level is greater than the first voltage level, the method comprising:

supplying a test signal having an active state, an inactive state and a voltage swing substantially equal to the first voltage level;

shifting the voltage swing of the test signal to a shifted voltage swing between the second voltage level and a selected bias level;

applying the test signal with the shifted voltage swing to a control terminal of a pull-up device, which is coupled between the pad terminal and the second voltage level, such that the pull-up device conducts current when the test signal is in the inactive state and does not conduct current when the test signal is in the active state; and measuring current through the buffer circuit when the test signal is in the active state.

19. An integrated circuit which operates at a core supply voltage and interfaces at an input-output (I/O) supply voltage, which is greater than the core supply voltage, the integrated circuit comprising:

a core terminal;

a pad terminal having a voltage swing substantially equal to the I/O supply voltage;

buffer means coupled between the core terminal and the pad terminal for buffering data signals between the core terminal and the pad terminal;

an output driver means having a pull-up transistor and a pull-down transistor coupled to the pad terminal for driving the pad terminal;

a DC current test node having an inactive state in a normal mode and an active state in a DC current test mode;

voltage level shifting means for receiving a test signal having a voltage swing substantially equal to the core supply voltage on a test signal input, for shifting the voltage swing of the test signal to a voltage swing between the I/O supply voltage and a selected bias voltage and for applying the test signal on a test output at the shifted voltage level; and pull-up means coupled in parallel with the pull-up transistor between the pad terminal and the I/O supply voltage pulling the pad terminal toward the I/O supply voltage and for selectively isolating the pad terminal from the I/O supply voltage as a function of the test signal on the test output.

* * * * *